United States Patent
Fetterolf et al.

(10) Patent No.: US 10,840,174 B2
(45) Date of Patent: Nov. 17, 2020

(54) METALLIC SYNAPSES FOR NEUROMORPHIC AND EVOLVABLE HARDWARE

(71) Applicant: SAMSUNG ELECTRONICS CO., LTD., Suwon-si (KR)

(72) Inventors: Shawn P. Fetterolf, Cornwall, VT (US); Jin-Ping Han, Yorktown Heights, NY (US); Christian Lavoie, Pleasantville, NY (US); Paul S. McLaughlin, Poughkeepsie, NY (US); Ahmet S. Ozcan, San Jose, CA (US); Roger A. Quon, Rhinebeck, NY (US)

(73) Assignee: Samsung Electronics Co., Ltd., Suwon-si (KR)

( * ) Notice: Subject to any disclaimer, the term of this patent is extended or adjusted under 35 U.S.C. 154(b) by 849 days.

(21) Appl. No.: 15/485,681

(22) Filed: Apr. 12, 2017

(65) Prior Publication Data
US 2018/0300599 A1 Oct. 18, 2018

(51) Int. Cl.
| | |
|---|---|
| *G06N 3/063* | (2006.01) |
| *H01L 23/498* | (2006.01) |
| *G06N 3/08* | (2006.01) |
| G06N 3/12 | (2006.01) |
| G06N 3/04 | (2006.01) |

(52) U.S. Cl.
CPC ..... *H01L 23/49827* (2013.01); *G06N 3/0635* (2013.01); *G06N 3/084* (2013.01); G06N 3/049 (2013.01); G06N 3/082 (2013.01); G06N 3/126 (2013.01)

(58) Field of Classification Search
CPC ........... H01L 23/49827; G06N 3/0635; G06N 3/084; G06N 3/049; G06N 3/082; G06N 3/126
See application file for complete search history.

(56) References Cited

U.S. PATENT DOCUMENTS

| | | | |
|---|---|---|---|
| 4,931,763 | A | 6/1990 | Ramesham et al. |
| 5,315,162 | A | 5/1994 | McHardy et al. |
| 5,451,811 | A | 9/1995 | Whitten et al. |
| 5,541,869 | A | 7/1996 | Rose et al. |
| 7,978,510 | B2 | 7/2011 | Modha et al. |
| 8,311,965 | B2 | 11/2012 | Breitwisch et al. |
| 8,796,658 | B1 | 8/2014 | Nazarian et al. |

(Continued)

OTHER PUBLICATIONS

Rajendran et al, "Neuronnorphic Computing Based on Emerging Memory Technologies", Jun. 2016, IEEE Journal on Emerging and Selected Topics in Circuits and Systems, all pages (Year: 2016).*

(Continued)

*Primary Examiner* — Daniel C Puentes
(74) *Attorney, Agent, or Firm* — NSIP Law

(57) ABSTRACT

Technical solutions are described for configuring a synaptic array. An example computer implemented method includes selecting a first electronic circuit and a second electronic circuit from the synaptic array for executing a task. The method further includes connecting the first electronic circuit to the second electronic circuit to facilitate passage of electric current by forming a metallic protrusion to connect a first connector of the first electronic circuit and a second connector of the second electronic circuit.

20 Claims, 10 Drawing Sheets

(56) References Cited

U.S. PATENT DOCUMENTS 9,842,647 B1 * 12/2017 Strachan ............ G11C 13/0069
2015/0154469 A1 * 6/2015 Park .................. G06K 9/00986
706/18

OTHER PUBLICATIONS

Minerbi et al., "Long-term relationships between synaptic tenacity, synaptic remodeling, and network activity," PLoS Biol, vol. 7, No. 6, 2009, e1000136., pp. 1-20.

Thompson, Adrian, "An Evolved Circuit, Intrinsic in Silicon, Entwined with Physics," "International Conference on Evolvable Systems," Springer Berlin Heidelberg, 1996, pp. 390-405.

Yang et al., "On-demand nanodevice with electrical and neuromorphic multifunction realized by local ion migration," ACS Nano, vol. 6, No. 11, 2012, pp. 9515-9521.

* cited by examiner

US 10,840,174 B2

METALLIC SYNAPSES FOR NEUROMORPHIC AND EVOLVABLE HARDWARE

BACKGROUND

The present invention relates generally to neuromorphic and synaptronic systems. More particularly, the present invention relates to solid state, adjustable weight synapses for controlling the interaction of neurons in such neuromorphic-synaptronic system.

Neuromorphic-synaptronic systems, also referred to as artificial neural networks, are computational systems that permit electronic systems to function in a manner analogous to that of biological brains. Neuromorphic-synaptronic systems do not generally utilize the traditional digital model of manipulating 0s and 1s. Instead, neuromorphic-synaptronic systems use connections between processing elements that are roughly functionally equivalent to neurons of a biological brain. Neuromorphic-synaptronic systems may include various electronic circuits that are modeled on biological neurons and synapses to form an artificial neural network (ANN). The ANN models biological systems, in which the point of contact between an axon of a neuron and a dendrite on another neuron is called a synapse, and with respect to the synapse, the two neurons are respectively called pre-synaptic and post-synaptic. The essence of our individual experiences is stored in conductance of the synapses.

Accordingly, a typical ANN includes a vast number of synapses that interconnect one or more electronic circuits that represent a digitized neuron. The ANN further uses a memory encoding process of weight changes at one or more neurons to facilitate decision making.

SUMMARY

According to one or more embodiments of the present invention, a computer implemented method for configuring a synaptic array, includes selecting a first electronic circuit and a second electronic circuit from the synaptic array for executing a task. The method further includes connecting the first electronic circuit to the second electronic circuit to facilitate passage of electric current by forming a metallic protrusion to connect a first connector of the first electronic circuit and a second connector of the second electronic circuit.

According to one or more embodiments of the present invention, a neuromorphic system includes a synaptic array, and a neuromorphic controller coupled with the synaptic array for configuring the synaptic array. The neuromorphic controller configures the synaptic array by selecting a first electronic circuit and a second electronic circuit from the synaptic array for executing a task. Further, the neuromorphic controller connects the first electronic circuit to the second electronic circuit to facilitate passage of electric current by forming a metallic protrusion to connect a first connector of the first electronic circuit and a second connector of the second electronic circuit.

According to one or more embodiments of the present invention, a computer program product for configuring a synaptic array includes a computer readable storage medium having program instructions embodied therewith. The program instructions are executable by a processing circuit to cause the processing circuit to select a first electronic circuit and a second electronic circuit from the synaptic array for executing a task. The program instructions further cause the processing circuit to connect the first electronic circuit to the second electronic circuit to facilitate passage of electric current by forming a metallic protrusion to connect a first connector of the first electronic circuit and a second connector of the second electronic circuit.

BRIEF DESCRIPTION OF THE DRAWINGS

The examples described throughout the present document will be better understood with reference to the following drawings and description. The components in the figures are not necessarily to scale. Moreover, in the figures, like-referenced numerals designate corresponding parts throughout the different views.

DETAILED DESCRIPTION

Figure 1:
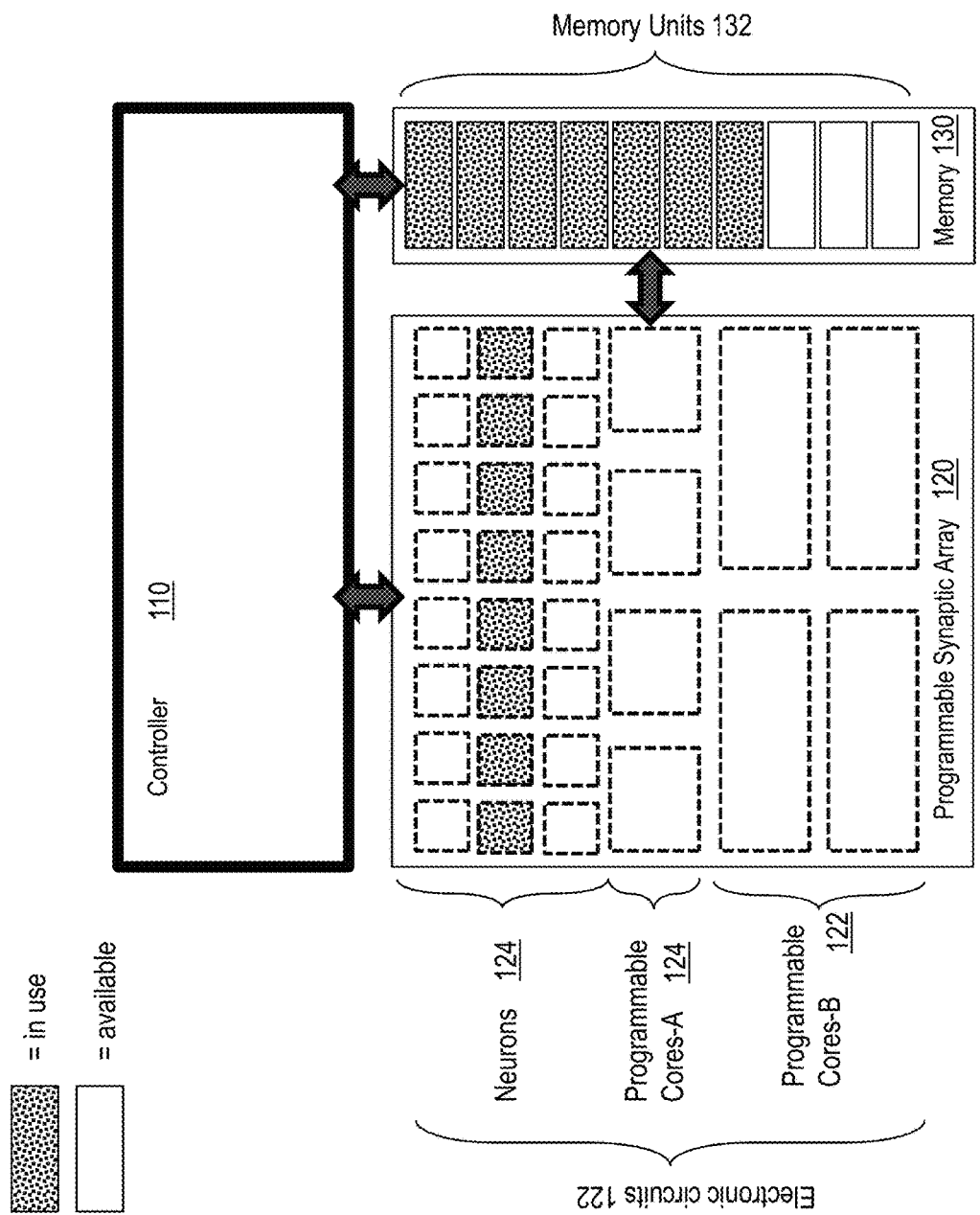
FIG. 1 illustrates an example neuromorphic system, according to one or more embodiments of the invention.

Described are technical features for fabricating solid-state synapses, thus enabling an aspect of neuromorphic and evolvable hardware, particularly for cognitive systems. Further, the technical features facilitate improving solid state architectures of neuromorphic and evolvable hardware that leave significant numbers of devices (or transistors) unused, or unusable, degrading the cost efficiency of the chip or system.

For example, typical neural network algorithms for machine learning use point neurons and weight changes for learning. Hence, typical cognitive hardware changes weights of neurons in hardware, for example, using non-volatile memory. However, to overcome limitations of techniques relying on weight-changing of neurons, and to facilitate machine intelligence, the technical features described herein facilitate an artificial neural network making new synapses in hardware with very high density, and also eliminate or break synapses.

Algorithms such as hierarchical temporal memory (HTM) incorporate the formation of new synapses (in other words, evolving network topology) as the basis of machine learning. In the human brain, formation and/or elimination of synapses has been identified to facilitate learning. Typically, in ANNs, formation and elimination of synapses can be achieved in a memory. The technical features herein further improve evolvable artificial neural networks, by facilitating forming/eliminating synapses beyond the standard memory requirements, such as 2 or more states—read/write.

In one or more examples of the invention, synapses are formed (and broken) between electronic circuits in a programmable array, where the electronic circuits include processing units, memory units, or combinations thereof. The synapses are formed using electro-migration, where the electro-migration synapses are solid-state devices which can be miniaturized to provide the extremely large number of synapses (hundreds, thousands), which are required for an artificial neural network. The technical features herein facilitate providing a temporary interconnect between the input and output terminals of a synapse, such that the synapse may be eliminated using reverse electro-migration.

The solid-state electro-migration synapses described herein are well suited for use in ANNs, such as where the synapse terminals are spaced apart at distances of less than 100 microns. The rate at which the metallic electro-migration synapses can be grown and/or eliminated is such that conductivity over such inter-terminal distances can be rapidly varied to for operation of the neural networks.

Further, the technical solutions herein facilitate forming the synapses by growing metallic protrusions within predetermined portions of connectors of the electronic circuitry. The technical solutions provide examples of manufacturing a programmable synaptic array with electronic circuits using one or more technical features to facilitate formation and/or elimination of the synapses in the predetermined area during runtime, that is during use of the array. Further yet, the technical features described herein improve the efficiency of formation and/or elimination of the synapses during runtime.

FIG. 1 illustrates an example neuromorphic system 100, according to one or more embodiments of the invention. The neuromorphic system 100 includes, among other components, a neuromorphic controller 110, a programmable synaptic array 120, and a memory 130. In one or more examples, the neuromorphic system 100 implements the one or more technical features described herein to form/break electro-migration synapses in the synaptic array 120. The formation/breaking of the synapses facilitates the neuromorphic system 100 to learn and program new tasks using the synaptic array 120.

For example, the neuromorphic controller 110 is a computer system that periodically (for example, every 8 hours) configures the synaptic array 120. In one or more examples, configuring the synaptic array 120 includes consolidation of the one or more electronic circuits of the synaptic array 120, which includes changing a network topography (new connections made, some connections erased) of the one or more electronic circuits of the synaptic array 120.

Figure 2:
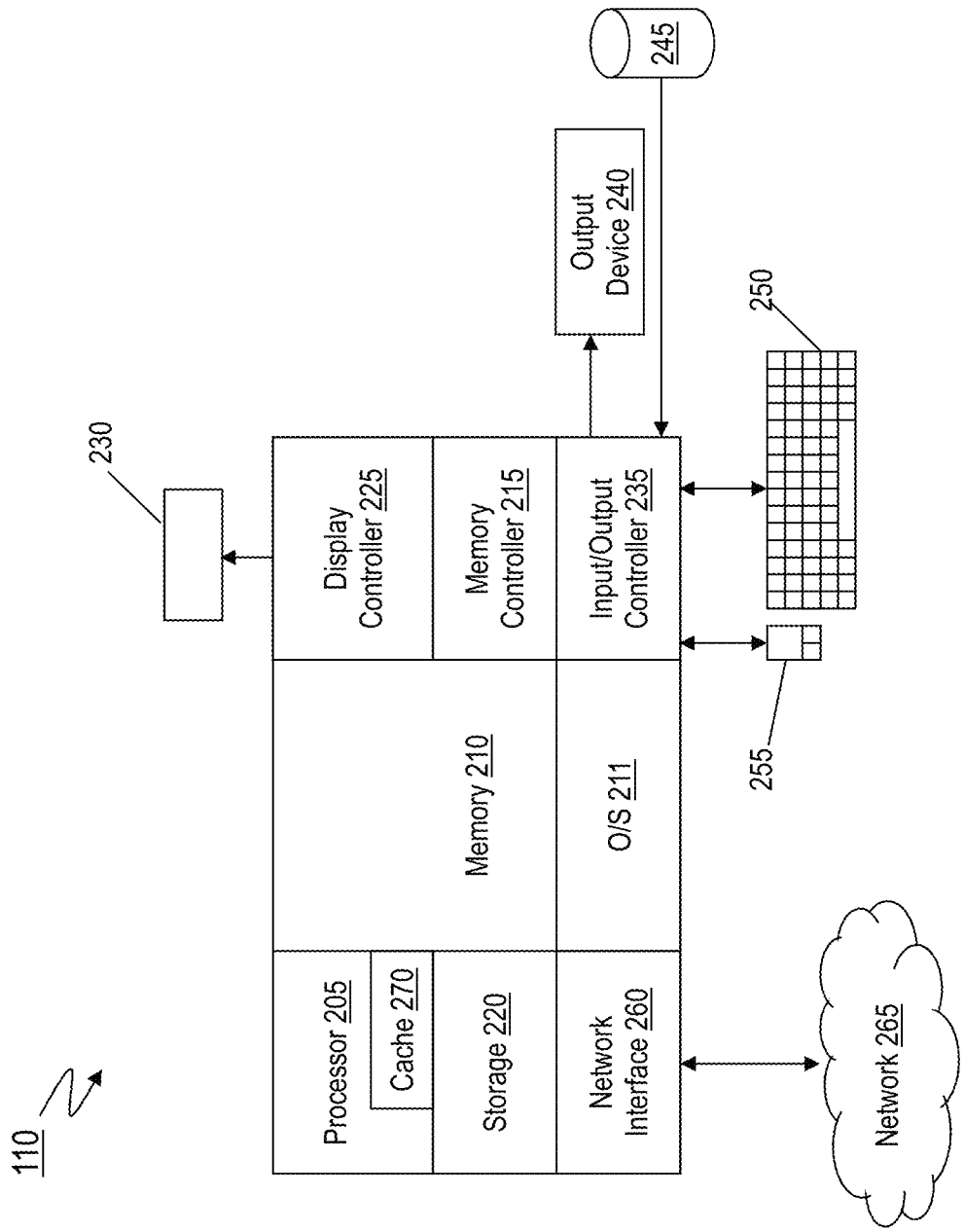
FIG. 2 illustrates an example neuromorphic controller, according to one or more embodiments.

FIG. 2 illustrates an example neuromorphic controller 110, according to one or more embodiments. The neuromorphic controller 110 can be a communication apparatus, such as a computer. For example, the neuromorphic controller 110 can be a desktop computer, a tablet computer, a laptop computer, a phone, such as a smartphone, a server computer, or any other device that communicates via a network 265. Alternatively, or in addition, the neuromorphic controller 110 is a high performance system-on-a-chip (SOC), an application specific integrated circuit (ASIC), or a field programmable gate array (FPGA) that is configured to execute a genetic/learning algorithm.

In one or more examples, the neuromorphic controller 110 includes, among other components, a processor 205, memory 210 coupled to a memory controller 215, and one or more input devices 245 and/or output devices 240, such as peripheral or control devices, that are communicatively coupled via a local I/O controller 235. These devices 240 and 245 can include, for example, battery sensors, position sensors (for example, altimeter, accelerometer, GPS), indicator/identification lights and the like. Input devices such as a conventional keyboard 250 and mouse 255 can be coupled to the I/O controller 235. The I/O controller 235 can be, for example, one or more buses or other wired or wireless connections, as are known in the art. The I/O controller 235 can have additional elements, which are omitted for simplicity, such as controllers, buffers (caches), drivers, repeaters, and receivers, to enable communications.

The I/O devices 240, 245 can further include devices that communicate both inputs and outputs, for instance disk and tape storage, a network interface card (MC) or modulator/demodulator (for accessing other files, devices, systems, or a network), a radio frequency (RF) or other transceiver, a telephonic interface, a bridge, a router, and the like.

The processor 205 is a hardware device for executing hardware instructions or software, particularly those stored in memory 210. The processor 205 can be a custom made or commercially available processor, a central processing unit (CPU), an auxiliary processor among several processors associated with the Neuromorphic controller 110, a semiconductor based microprocessor (in the form of a microchip or chip set), a macroprocessor, or other device for executing instructions. The processor 205 includes a cache 270, which can include, but is not limited to, an instruction cache to speed up executable instruction fetch, a data cache to speed up data fetch and store, and a translation lookaside buffer (TLB) used to speed up virtual-to-physical address translation for both executable instructions and data. The cache 270 can be organized as a hierarchy of more cache levels (L1, L2, and so on.).

The memory 210 can include one or combinations of volatile memory elements (for example, random access memory, RAM, such as DRAM, SRAM, SDRAM) and nonvolatile memory elements (for example, ROM, erasable programmable read only memory (EPROM), electronically erasable programmable read only memory (EEPROM), programmable read only memory (PROM), tape, compact disc read only memory (CD-ROM), disk, diskette, cartridge, cassette or the like). Moreover, the memory 210 can incorporate electronic, magnetic, optical, or other types of storage media. Note that the memory 210 can have a distributed architecture, where various components are situated remote from one another but can be accessed by the processor 205.

The instructions in memory 210 can include one or more separate programs, each of which includes an ordered listing of executable instructions for implementing logical functions. In the example of FIG. 2, the instructions in the memory 210 include a suitable operating system (OS) 211. The operating system 211 essentially can control the execution of other computer programs and provides scheduling, input-output control, file and data management, memory management, and communication control and related services.

Additional data, including, for example, instructions for the processor 205 or other retrievable information, can be stored in storage 220, which may be a storage device such as a hard disk drive or solid state drive. The stored instructions in memory 210 or in storage 220 can include those enabling the processor to execute one or more aspects of the systems and methods described herein.

The neuromorphic controller 110 can further include a display controller 225 coupled to a user interface or display 230. In some embodiments, the display 230 can be an LCD screen. In other embodiments, the display 230 can include a plurality of LED status lights. In some embodiments, the Neuromorphic controller 110 can further include a network interface 260 for coupling to a network 265. The network 265 can be an IP-based network for communication between the Neuromorphic controller 110 and an external server, client and the like via a broadband connection. In an embodiment, the network 265 can be a satellite network. The network 265 transmits and receives data between the Neuromorphic controller 110 and external systems. In some embodiments, the network 265 can be a managed IP network administered by a service provider. The network 265 can be implemented in a wireless fashion, for example, using wireless protocols and technologies, such as WiFi, WiMax, satellite, or any other. The network 265 can also be a packet-switched network such as a local area network, wide area network, metropolitan area network, the Internet, or other similar type of network environment. The network 265 can be a fixed wireless network, a wireless local area network (LAN), a wireless wide area network (WAN) a personal area network (PAN), a virtual private network (VPN), intranet or other suitable network system and can include equipment for receiving and transmitting signals.

Referring back to FIG. 1, the synaptic array 120 includes multiple electronic circuits 122 that can be programmed for executing a task. In one or more examples, the task is a portion, such as a subset of operations, of an ANN. For example, the electronic circuits 122 can include processors, or any other logical units that can be pre-configured, or that can be dynamically programmed to perform one or more tasks. In one or more examples, the electronic circuits 122 can include digital neurons.

The electronic circuits 122 can be coupled with each other to form programmable cores. In one or more examples, different types of programmable cores, such as programmable cores-A 126 and programmable cores-B 128 can be formed using a combination of one or more of the electronic circuits 122.

For example, consider that an example repetitive task to be performed by the controller 110 is to add integers P+Q+R. The programmable cores 122 can include one or more adder circuits. Accordingly, the neuromorphic controller 110 can configure a programmable core by selecting two adder circuits to operate in sequence, where a first adder circuit receives P and Q as inputs, and a second adder circuit receives the result of the first adder circuit (P+Q), and R as inputs. Accordingly, the neuromorphic controller 110 creates a programmable core 124 using one or more electronic circuits 122. The neuromorphic controller 110 couples the first and second adder circuits by forming metallic synapses between connectors of the two adder circuits.

It should be noted that the types of electronic circuits and their combinations depicted herein are exemplary and that in other examples, different types of electronic circuits can be used and combined in different, and/or additional manner. For example, the electronic circuits can include processors, arithmetic logic units, digital signal processors, digital neurons, or any other such electronic circuits.

Figure 3:
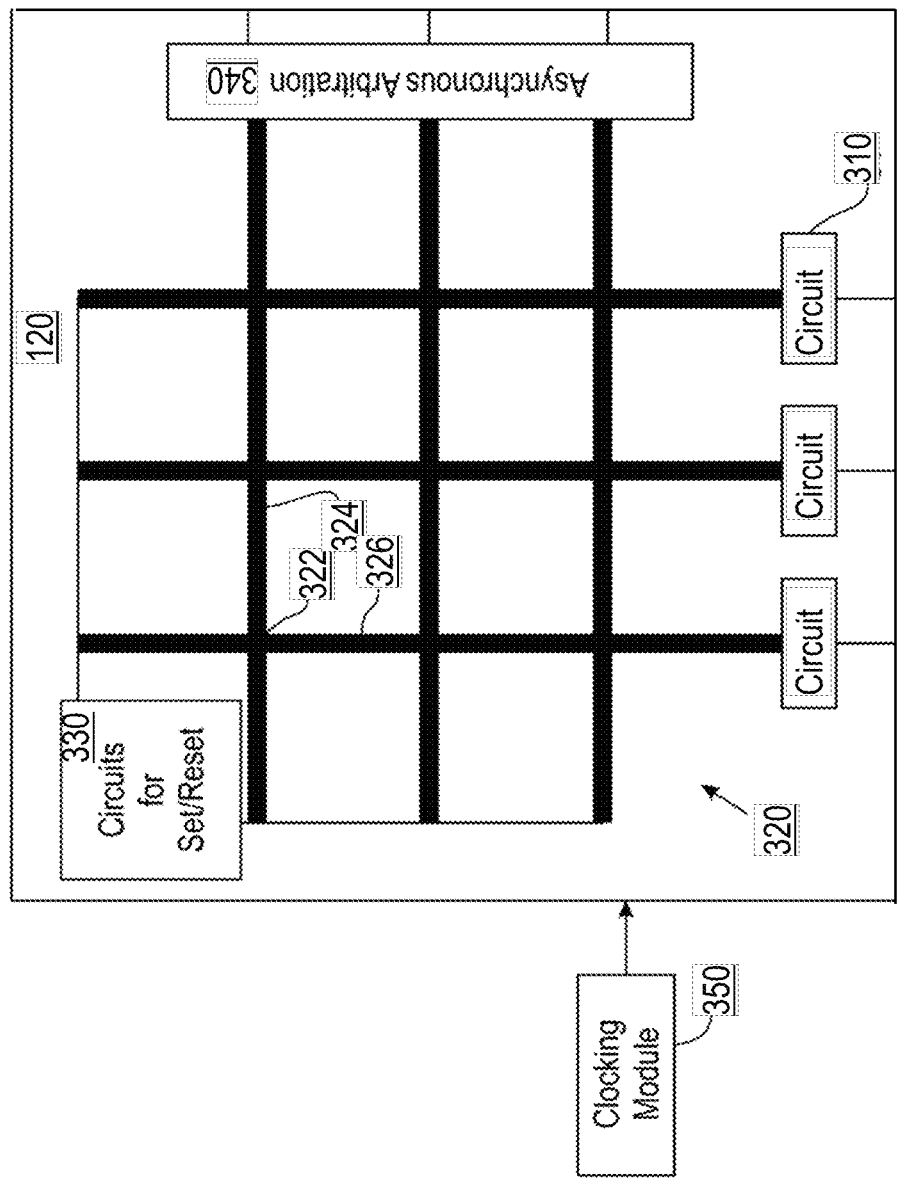
FIG. 3 illustrates an example synaptic array, according to one or more embodiments.

FIG. 3 illustrates an example synaptic array 120, according to one or more embodiments. The synaptic array 120 illustrated is a neuromorphic-synaptronic digital circuit that includes electronic circuits 310 coupled to a crossbar 320. The crossbar 320 includes axons 324, dendrites 326, and a synapse 322 at cross-point junctions of each axon 324 and each dendrite 326. As such, each connection between an axon 324 and a dendrite 326 is made through a synapse 322. In one or more examples, the synapse is a metallic protrusion that connects the axon 324 and the dendrite 326 to facilitate passage of electric current between the axon 324 and the dendrite 326. The electronic circuits 310 can include digital electronic neurons, processors, arithmetic logic units, digital signal processors, counters, filters, or any other such electronic circuits.

The junctions where the synapses 322 are located are referred to herein as cross-point junctions. In one or more examples, the crossbar array 320 can have a pitch in the range of about 0.1 nm to 10 μm. Circuits 330 for Set/Reset are peripheral electronics that are used to load learned synaptic weights into the chip. An asynchronous arbitration module 340 is used to sequentially activate each axon 324 within a time interval.

In one or more examples, the electronic circuits 310 can all be digital electronic neurons, and the neuromorphic controller 110 configures the crossbar 320 to program an ANN. For example, the controller 110, in addition to forming/breaking synapses 322, configures one or more parameters (such as a synaptic weight) that define functional behavior of the synapses 322. As such, synaptic weights for synapses 322 affect the functional behavior of the synapses 322. Such synaptic weights, can be learned via simulation and loaded on the synaptic array 120 to define function of the synapses on the array 120.

For example, a spike signal from a digital neuron on the array 120 creates a voltage bias across a connected synapse 322, resulting in a current flow into down-stream neurons. The magnitude of that current flow is based on the synaptic weight (conductance) of a synapse 322 between each pair of neurons. The magnitude of the current flow, or other sensing mechanisms, is used to deterministically read the synaptic weight of a synapse 322 on the circuit. In one or more examples, an interface module programs synaptic weights such that each synapse 322 in the crossbar 320 has a synaptic weight that affects (e.g., programs) the functional behavior (e.g., electrical conductivity) of the synapse 322 based on the corresponding synaptic weight (e.g., "0" indicating a synapse 322 is not conducting, "1" indicating the synapse 322 is conducting).

In general, an interconnection network, such as the crossbar 320 or cross-quilt architecture, includes a rectangular array or square N×N array of synapses 322 at cross-point junctions of N axons 324 and N dendrites 326 in the array 120. In one or more examples, the electronic circuits 310 are implemented using a digital, synchronous scheme. For example, when an electronic circuit 310 fires, all values (N) are read in parallel at dendrites 326, wherein the electronic circuit states update at a specified resolution, and each circuit 310 implements an axonal delay. As used herein, the term "when" can mean that a signal is sent instantaneously after an electronic circuit fires, or some period of time after the electronic circuit fires.

In one or more examples, the electronic circuits 310 are digital electronic neurons 310, which use synchronous designs, to operate as an ANN. The task that the neuromorphic controller 110 programs in the synaptic array 120 can be a forward pass, a backward pass, a weight-update, or any other operation of the ANN. For example, each neuron state update occurs at a resolution of about 0.1 msec to 1 msec. In one or more examples, the states of the neurons 310 coupled to the interconnection network 320 are updated at a resolution of about 0.1 msec to 1 msec, necessitating a clock rate of 1 to 10 kHz, generated by a digital clocking module 350. As such, each time-step of 1 msec is divided into N steps, requiring a final clock rate of N to 10*N KHz. For example, when N=512, the clock rate would be 512 kHz to 5.12 MHz. Other example values for N include 32, 64, 128, 256, 1024, and so on. In one or more examples, when a neuron 310 fires, all N values maintained by N synapses 322 connected to the neuron 310 are read in parallel at the dendrites 326. Accordingly, in such examples of an ANN, the neuromorphic controller 110 reconfigures the crossbar 320 dynamically to change the interconnection of the neurons 310, and thus change the machine learning. For example, the controller 110 forms and/or breaks the synapses 322 that facilitate passage of the electric current between the neurons 310, resulting from forward pass, backward pass, weight-update, or any other operating phase of the ANN. By changing the interconnections, the controller 110 effectively changes the training of the ANN. In other words, the neuromorphic controller 110 reconfigures the operation of the ANN implemented by the synaptic array 120 by changing the interconnections between the electronic circuits 122 that operate as the neurons of the ANN.

Referring back to FIG. 1, the neuromorphic system 100 further includes the memory 130, which includes one or more memory units 132 that the neuromorphic controller 110 assigns to the task being programmed in the array 120. For example, the controller 110 forms synapses between a set of selected electronic circuits 122 and a set of selected memory units 132 from the memory 130, where the selected sets of electronic circuits 122 and the memory units 132 are assigned for executing the task. The selected memory units 132 can be used to store data for executing the task, such as variable values, neuron weights, and the like.

In one or more examples, additional electronic circuits and additional memory units can be added to the system 100. For example, one or more synaptic arrays can be connected to the synaptic array 120, and/or to the neuromorphic controller 110, which can form/break synapses in the multiple synaptic arrays.

Figure 4:
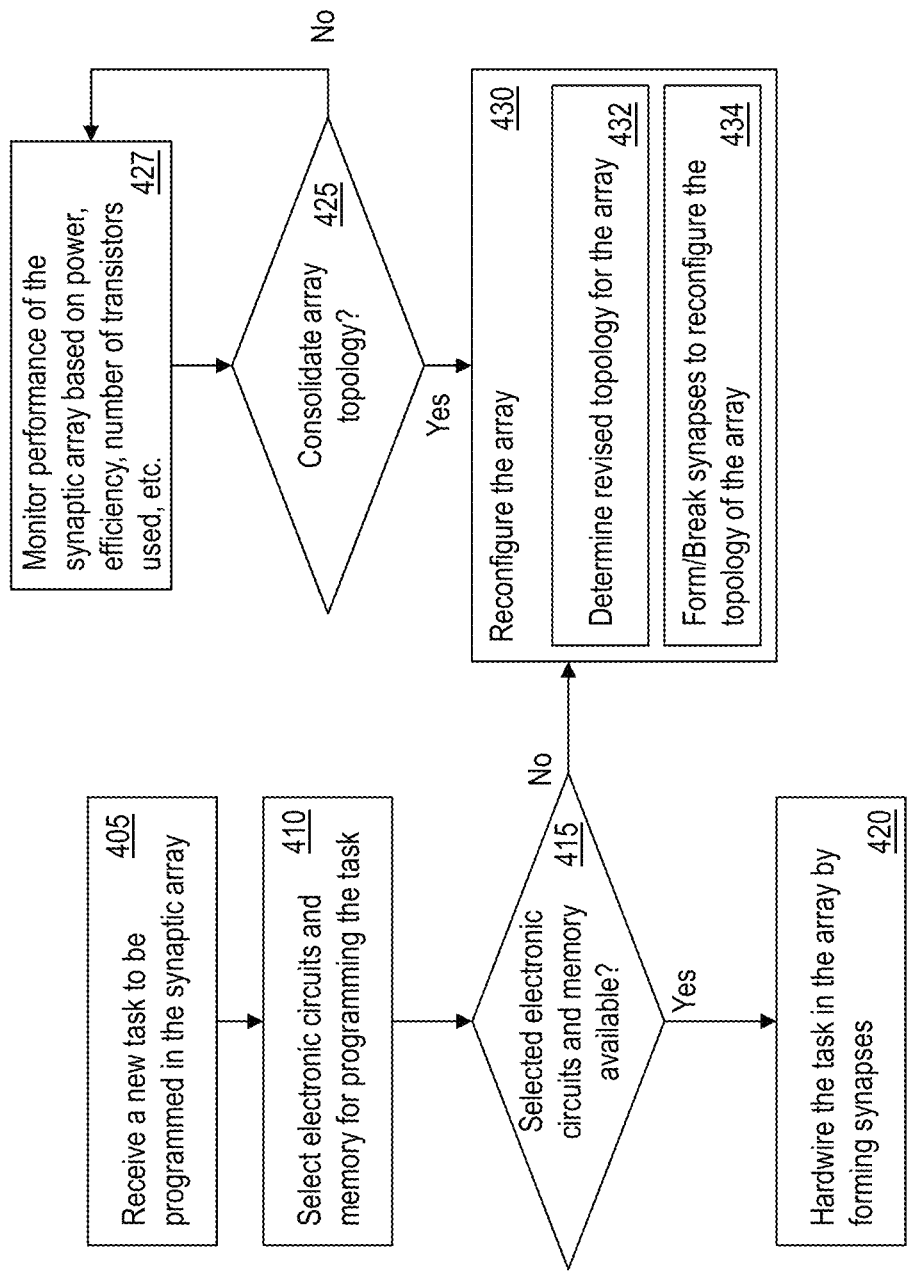
FIG. 4 illustrates a flow chart of an example method for reconfiguring the synaptic array, according to one or more embodiments.

FIG. 4 illustrates a flow chart of an example method for reconfiguring the synaptic array 120, according to one or more embodiments. For example, the neuromorphic controller 110 receives a new task to be programmed in the synaptic array 120, as shown at 405. For example, the task can be a repetitive task, such as an arithmetic operation, a forward pass, a backward pass, a weight-update, or any other such task that can be performed using electronic circuits. In one or more examples, the receipt of the task is accompanied by a set of performance requirements and/or specifications.

In one or more examples, the specifications provide a number and/or type of electronic circuits 122 and memory units 132 to be used for executing the task. Alternatively, or in addition, the neuromorphic controller 110 determines which electronic circuits 122 from the synaptic array 120 and the memory units 132 from the memory 130 are to be used for the task. The neuromorphic controller 110 accordingly selects a subset of the electronic circuits 122 and a subset of the memory units for the task, as shown at 410.

The neuromorphic controller 110 determines if the selected electronic circuits and memory units are available, or already in use, as shown at 415. In one or more examples, the neuromorphic controller can make the determination based on a data structure that records an identifier of the electronic circuits 122 and/or the memory units 132 that are already assigned to a task. The neuromorphic controller 110 makes the determination using other techniques, such as based on a flag for each electronic circuit and/or memory unit, in other examples.

If the selected sets of electronic circuits 122 and the memory units 132 are available, the neuromorphic controller 110 proceeds to hardwire the task in the synaptic array 120 by forming synapses 322 between the selected components, as shown at 420. In one or more examples, the neuromorphic controller can take additional steps after formation of the synapses, such as setting up one or more parameters of the synapses. For example, if the task is part of an ANN, the neuromorphic controller 110 sets the synaptic weights after creating the synapses 322 between the selected neurons. In one or more examples, the memory units assigned to the task store the synaptic weights, and or other data associated with implementing the task, such as a gradient.

If the selected electronic circuits 122 and the memory units 132 are not available, that is already in use, the neuromorphic controller 110 can determine if alternative electronic circuits of the same type as those specified for the task are available in the synaptic array 120. If alternative electronic circuits are available, the neuromorphic controller 110 can use those electronic circuits.

Else, if the none of the available electronic circuits 122 meet the specifications, the neuromorphic controller 110 reconfigures the synaptic array 120, as shown at 430. In one or more examples, the neuromorphic controller 110 consolidates the synaptic array 120 periodically, as shown at 425. For example, the neuromorphic controller 110 checks if a consolidation is to be performed based on a predetermined frequency, such as every 8 hours, every 4 hours, or the like. If such a periodic consolidation is to be performed, the neuromorphic controller 110 initiates the reconfiguration of the synaptic array 120, as shown at 430.

In one or more examples, the neuromorphic controller 110 determines whether to consolidate and reconfigure the synaptic array 120 to optimize the programmable cores based on size, for example to reduce transistors used. Alternatively, or in addition, the neuromorphic controller 110 reconsolidates the topology of the synaptic array to optimize power consumption, and thus reduce power waste. Further yet, in one or more examples, the neuromorphic controller 110 can reconsolidate the topology increase instances of a single repetitive task, so as to improve computing efficiency by wiring the task in multiple instances. In one or more examples, the neuromorphic controller 110 monitors the performance of the synaptic array 120 according to one or more of such parameters, as shown at 427. The neuromorphic controller 110 compares the monitored values of the synaptic array 120 with corresponding predetermined thresholds, for example a threshold for a number of transistors assigned to a task, a threshold for amount of power consumed by a task, a threshold for an amount of time for executing a task, and so on. If one or more of the thresholds is exceeded, the neuromorphic controller 110 initiates the reconfiguration, as shown at 425. In one or more examples, the neuromorphic controller 110 compares the monitored values with the corresponding predetermined thresholds at the predetermined frequency to determine whether to initiate the reconfiguration.

Reconfiguring the synaptic array 120 includes determining a revised configuration for the array 120, as shown at 432. The configuration includes synapses 322 among one or more electronic circuits from the electronic circuits 122 and/or the memory units 132. The neuromorphic controller 110 determines a task that cannot be in operation, and mark the resources, that is the electronic circuits and the memory units assigned to such a task as available. Alternatively, or in addition, the controller 110 can receive a configuration to use, for example from an administrator.

Based on the revised topology, the neuromorphic controller 110 forms and/or breaks synapses 322 of the array 120, as shown at 434. For example, the neuromorphic controller 110 breaks a synapse connecting a first electronic circuit and a second electronic circuit from the array 120, and instead form a synapse connecting the first electronic circuit to a third electronic circuit. Alternatively, or in addition, the neuromorphic controller 110 changes the synapse between an electronic circuit and a memory unit, by breaking a synapse and forming a new one.

In one or more examples, the neuromorphic controller 110 causes the synaptic array 120 to form/break the synapses 322 using electro-migration, or metal migration, which is a process related to electroplating. Typically, metal migration takes place between conductors in an electronic circuit in the presence of a moisture film. For example, under the influence of a DC voltage, metal ions dissolve from the positive conductor (the anode). The dissolved ions migrate through the moisture film (the electrolyte) and plate out on the negative conductor (the cathode). The deposit takes the form of a metallic connection that reaches the anode and creates an ohmic contact, thus forming the synapse. It should be noted that, depending on the medium, synapse formation between some conductors, such as copper, can proceed either from the cathode to the anode, or from the anode to cathode, which is the reverse of other metals.

The electro-migration occurs at a minimum or "critical" voltage Vc, which can range from a few millivolts to over 2 volts, depending on the metal and prevailing conditions surrounding the electronic circuit. Once Vc is exceeded, growth rates tend to increase linearly with (V−Vc). Thus, the neuromorphic controller 110 controls the formation of the synapse between a pair of electronic circuits 122 (or memory units 132) by varying the DC voltage applied across the permanent interconnects (axons 324 and dendrites 326) in the crossbar 320.

Figure 5:
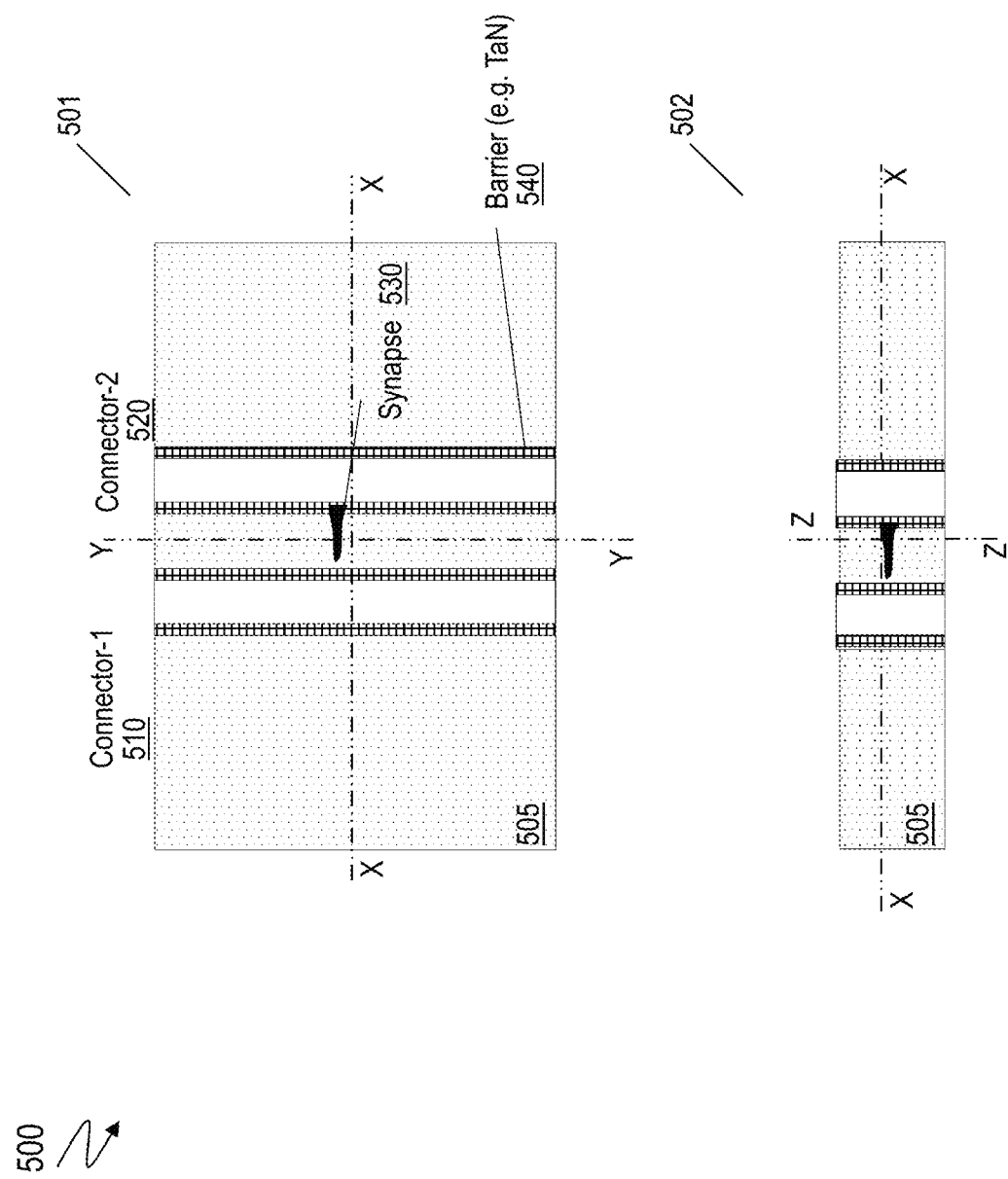
FIG. 5 illustrates a top-view and a cross-sectional view of a structure during an intermediate operation of a method of fabricating the semiconductor synaptic array according to one or more embodiments.

FIG. 5 illustrates a top-view 501 and a cross-sectional view 502 of a structure 500 during an intermediate operation of a method of fabricating the semiconductor synaptic array 120 according to one or more embodiments. The structure illustrated in FIG. 5 facilitates formation/breaking of a synapse 530 between a pair of connectors 510 and 520 that are on the same level of the fabricated semiconductor.

The connectors 510, 520 illustrated in FIG. 5 are parallel to each other and in substantially the same plane, or at the same level of the semiconductor fabrication of the synaptic array 120. The interconnect-1 510 and the interconnect-2 520 can be any of the connectors in the crossbar 320, such as the axons 324 or the dendrites 326. For example, the interconnect-1 510 and the interconnect-2 520 can both be axons 324, can both be dendrites 326, or one of each. The structure 500 illustrated in FIG. 5 includes a single pair of connectors, however it is understood that in other examples, the structure includes multiple connectors to form the crossbar 320. The cross-sectional view 502 is depicted along the line X-X illustrated in the top view 501 of the structure 500.

FIG. 5 depicts the structure 500 after forming an insulating layer, or an interlayer dielectric (ILD) 505. Any known manner of forming the ILD 505 can be utilized. In some embodiments, the ILD 505 is deposited by a spin-on coating operation. The ILD 505 can be any suitable dielectric material, such as, for example, an oxide. The ILD 505 can be composed of a dielectric material that is selected from the group consisting of aluminum oxide ($Al_2O_3$), magnesium oxide (MgO), boron nitride (BN), silicon oxynitride ($Si-O_xN_y$), silicon oxide ($SiO_2$), and combinations thereof.

The structure 500 further includes connectors 510 and 520, which are conductive contacts formed in the ILD 505 to facilitate passage of electric current to the electronic circuits 122. The connectors 510 and 520 can be composed of any electrically conductive material. "Electrically conductive" as used through the present description means a material typically having a room temperature conductivity of greater than 10-8 $(\Omega\text{-m})^{-1}$. The connectors 510 and 520 can be of any suitable conducting material, such as, for example, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials.

Any known manner of forming the connectors 510 and 520 can be utilized. In some embodiments, vias are formed in the ILD 505 and the connectors 510 and 520 are deposited in the vias (not illustrated). In one or more examples the trenches are formed instead of the vias. The examples herein use vias, however it would be clear to a person skilled in the art how a trench can be used instead of a via. For example, if the connectors 510 and 520 are of metal, such as copper, and include a barrier metal liner 540, the barrier metal liner 540 is deposited into the vias prior to depositing the connectors into the vias. The barrier metal liner 540 prevents the copper from diffusing into, or doping, the surrounding materials, which can degrade their properties. Silicon, for example, forms deep-level traps when doped with copper. An ideal barrier metal liner must limit copper diffusivity sufficiently to chemically isolate the copper conductor from the surrounding materials and should have a high electrical conductivity, for example, tantalum nitride and tantalum (TaN/Ta), titanium, titanium nitride, cobalt, ruthenium, and manganese.

In one or more embodiments, the connectors 510 and 520 can be deposited in vias made in the ILD 505 using a physical vapor deposition (PVD) process. Example PVD processes that are suitable for forming the connectors 510 and 520 include plating, sputtering, electroplating, electrophoretic deposition, and combinations thereof. In other embodiments, the conductive material can be deposited using a chemical vapor deposition process, such as plasma enhanced chemical vapor deposition (PECVD). In some embodiments, the material of the connectors 510 and 520 can be an electrically conductive semiconductor, such as n-type doped polysilicon. The conductive material can further include dopants that are incorporated during or after deposition. The interconnect materials and interfaces are conditioned to satisfy a minimum breakdown strength (measured as MV/cm), and is specified for the synaptic array 120, or for the crossbar 320 as Vmax.

Following deposition of the material for the connectors 510 and 520 in the vias of the ILD 505, a planarization process, such as chemical mechanical planarization (CMP) can be used to planarize the upper surface of the electrically conductive material that is present in the vias. In some embodiments, the planarization process can continue until the upper surface of the electrically conductive material that provides the connectors 510 and 520 within the vias is coplanar with the upper surface of the portion of the ILD 505 that is not etched. Optionally, a capping layer (not shown)

can be disposed on the exposed surface of the connectors 510 and 520. Typically, the capping layer is tantalum or a nitride thereof.

In one or more examples, the technical features herein facilitate manufacturing the synaptic array 120 so as to be able to tune the minimum breakdown strength as well as capability to control and apply voltage across a specific gap in the crossbar 320 to initiate a breakdown, or fail event. The controlled "breakdown" leads to a short (a current leakage path), which can be recorded. The leakage can be measured and assigned a relative weighting, for example similar to SRAM yields provided as a function of applied voltage. Accordingly, the controller 110 identifies an extrusion voltage to be applied to the connectors 510 and 520 to cause a protrusion, or an extrusion, of the interconnect material, and form the synapse 530. The extrusion voltage, in one or more examples, facilitates the interconnect material to extrude from the connector-1 510 (or connector-2) to reach the connector-2 520 (or connector-1) through the diffusion and/or dielectric barrier 540 that can be used. Alternatively, or in addition, the extrusion voltage is a breakdown voltage for the dielectric barrier 540 that causes at least a portion of the dielectric barrier 540 to become electrically conductive.

Thus, the controller 110 causes the synaptic array 120 to dynamically form the synapse 530 during reconfiguration by creating and/or applying the extrusion voltage between the connectors 510 and 520. The controller 110 identifies the connectors 510 and 520 based on the two connectors being associated with selected electronic circuits 122 that are to be used for executing the task.

Figure 6:
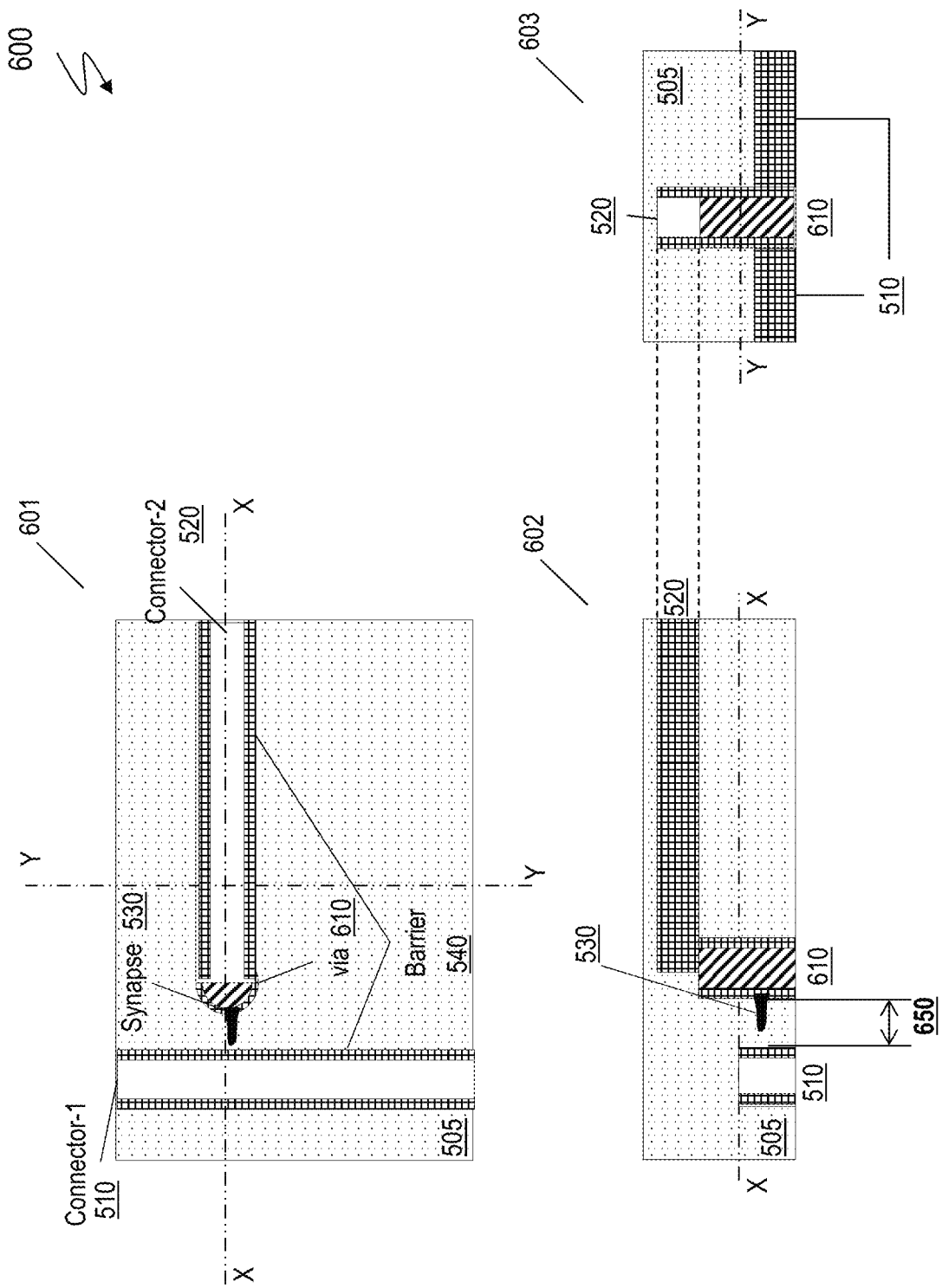
FIG. 6 illustrates a top-view, a cross-section view, and a side-view of a structure during an intermediate operation of a method of fabricating the semiconductor synaptic array according to one or more embodiments.
Figure 7:
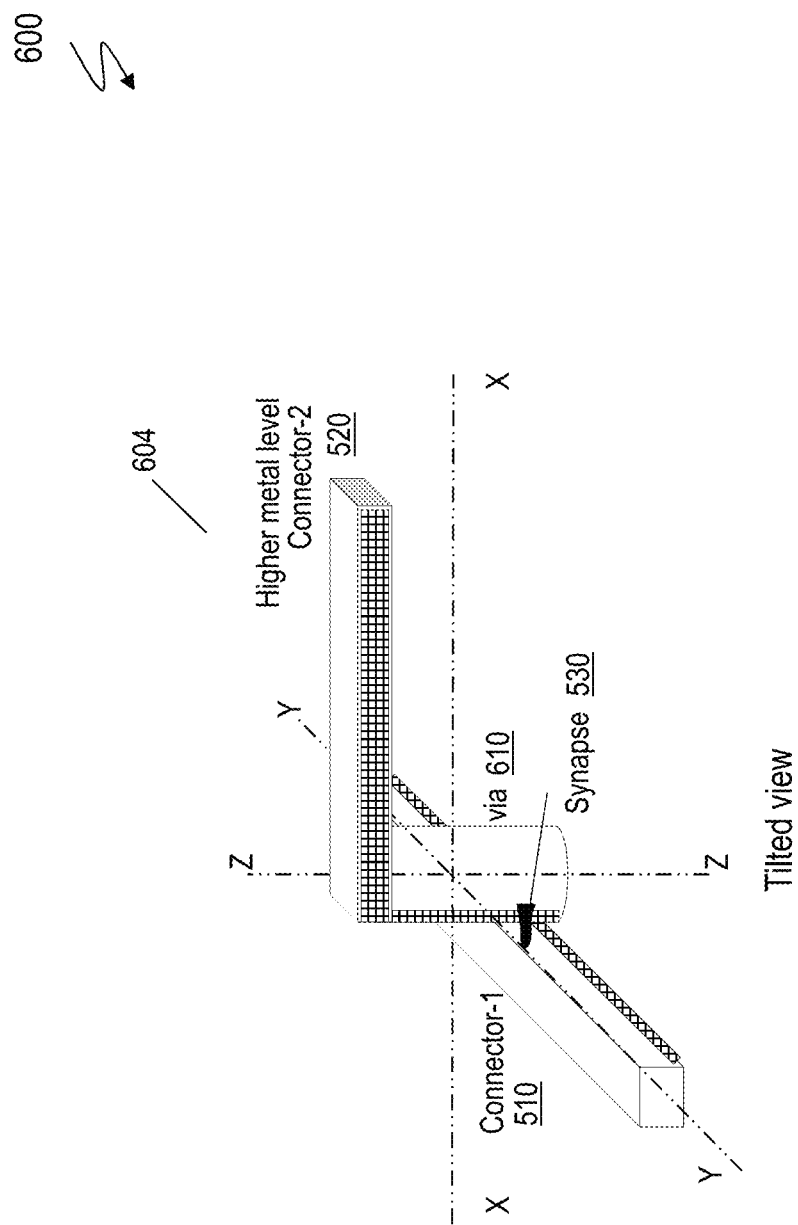
FIG. 7 illustrates a tilted view of a synaptic array according to one or more embodiments.

FIG. 6 illustrates a top-view 601, a cross-section view 602, and a side-view 603 of a structure 600 during an intermediate operation of a method of fabricating the semiconductor synaptic array 120 according to one or more embodiments. Further, FIG. 7 illustrates a tilted view 604 of the structure 600, according to one or more embodiments. The structure illustrated in FIG. 6 facilitates formation/breaking of a synapse 530 between a pair of connectors 510 and 520 that are on different levels of the fabricated semiconductor. The ILD 505 is not shown in the tilted view 602.

For example, one or more of the electronic circuits 122 are at different levels in the back end of line (BEOL) portion of the synaptic array 120. Alternatively, or in addition, the connectors 510 and 520, respectively of the first and second electronic circuits that are to be connected for the reconfiguration are on different levels. To facilitate growing the synapse 530 in such cases, the synaptic array 120 includes a via 610 that facilitates connecting the two connectors 510 and 520. In one or more examples, the via 610 is an extension of one of the connectors, for example the connector-2 520, in the direction of the connector-1 510. In such a case, the neuromorphic controller 110 applies the extrusion voltage to the via 610 and the connector-1 510, to cause the synapse 530 to be extruded from the via 610 to the connector-1 510. Alternatively, or in addition, the synapse 530 extrudes from the connector-1 510 to the via 610. It should be noted that although FIG. 6 depicts the via 610 as an extension of the connector-2 520, which is at a higher level than the connector-1 510, in other examples, the via 610 can be an extension of the connector-1 510.

Alternatively, or in addition, the via 610 is a standalone connector that is deposited in between the connector-1 510 and the connector-2 520 to facilitate extrusion of a pair of synapses towards both the interconnects (not shown). For example, a first synapse is generated between the via 610 and the connector-1 510, and a second synapse is generated between the via 610 and the connector-2 520.

The via 610 can be of the same or different material as the connectors 510 and 520. In one or more examples, the via 610 is formed by deposition of the interconnect material for the via 610 along the longitudinal axis of the connector-2 520, and extending along an axis that is orthogonal to the connector-2 520. The via 610 can also be substantially orthogonal to the connector-1 510. Alternatively, or in addition, the via 610 is formed at an offset from the longitudinal axis of the connector-2 520.

Thus, fabrication of the structure 600 includes deposition of the connector-1 510 on the ILD 505, followed by or in concurrence with the via 610. The via 610 is deposited at a predetermined breakdown distance 650 from the connector 510 to facilitate formation/breaking of the synapse 530. The breakdown distance 650 is based on the material of the barrier 540, so that the extrusion voltage applied by the neuromorphic controller 110 can form the synapse 530 between the connector 510 and the via 610 by applying the extrusion voltage.

Subsequently, the connector-2 520 is deposited such that it connects the via 610. Accordingly, formation/breaking of the synapse 530 between the connector-1 510 and the via 610, results in a connection between the connectors 510 and 520. In one or more examples, the connector-2 520 is deposited at the breakdown distance 650 from the via 610, and the neuromorphic controller 110 forms two synapses from the via 610, one towards each of the connectors 510 and 520, for connecting the electronic circuits associated with the two connectors 510 and 520.

Figure 8:
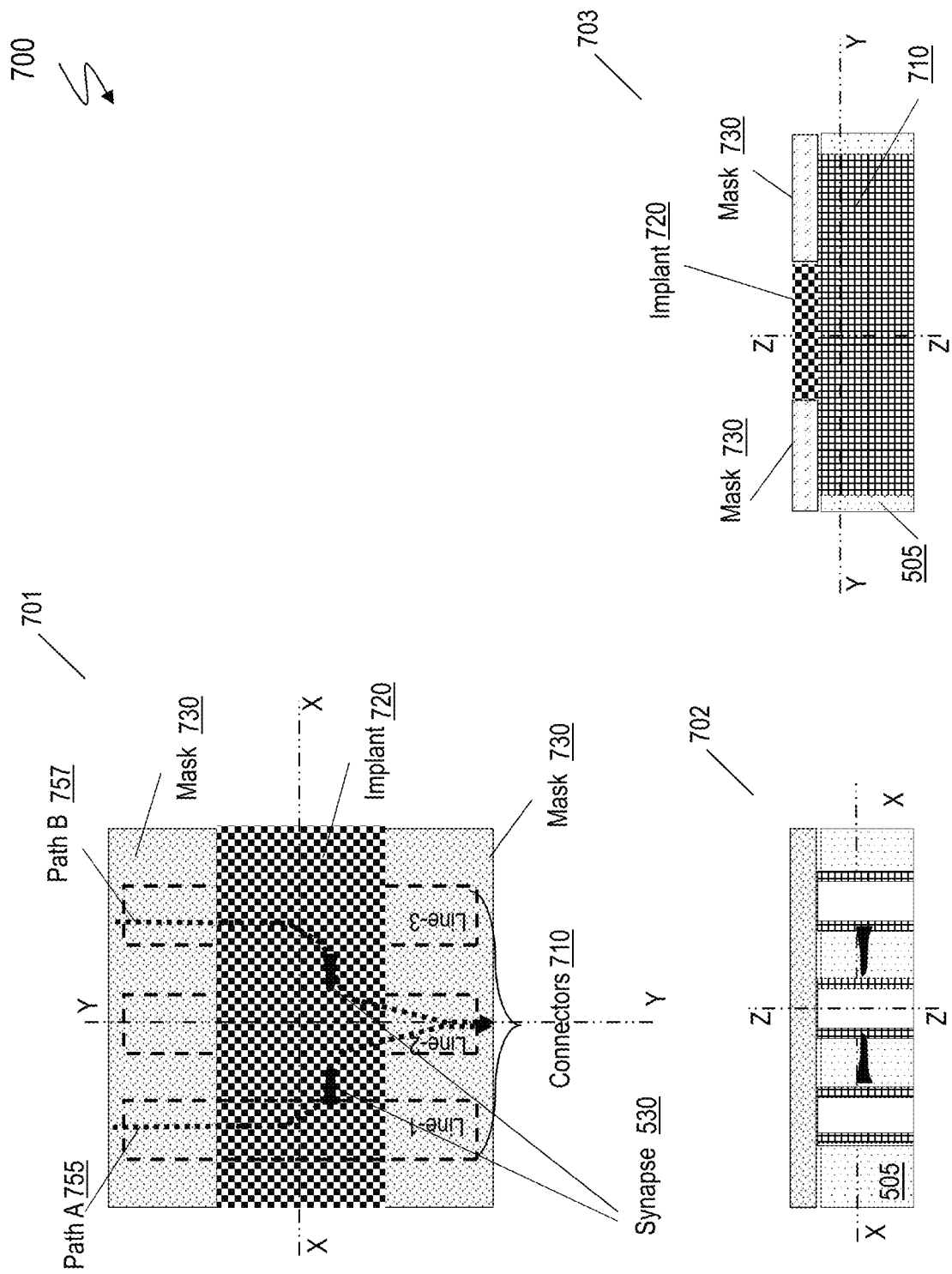
FIG. 8 illustrates an example of a structure of a synaptic array, in which connectors are pre-treated to make formation/breaking of synapses conducive, according to one or more embodiments.

The technical features herein further facilitate formation of the synapse 530 at a predetermined regions, or portions of the one or more interconnects. FIG. 8 illustrates an example of a structure 700 of the synaptic array 120, in which connectors 710 are pre-treated to make formation/breaking of synapses 530 conducive, according to one or more embodiments. FIG. 8 illustrates the top view 701, a cross-sectional view 702, and a side view 703, in which interconnect material and barrier material are formed on an ILD 505, as described herein. The views are during an intermediate operation of a method of fabricating the semiconductor synaptic array 120. The connectors 710 include the connectors 510 and 520, and/or the vias 610 described herein. Further, predetermined portions of the connectors 710 are treated to make formation/breaking of the synapses 530 conducive.

In one or more examples, the technical features herein facilitate creating leaky regions for facilitating the formation/breaking of the synapses 530. For example, a predetermined portion of connectors 710 from the crossbar 320 is fabricated in a manner to create a leaky region for formation of the synapses 530. In one or more examples, the predetermined portion can include one of the ends of the connector. Alternatively, or in addition, the predetermined portion can exclude either ends of the connectors 710. In one or more examples, the predetermined portion can be randomly selected. In one or more examples, the predetermined portion can include the entire length of the connectors 710.

The predetermined portion is made more conducive for formation/breaking of the synapses 530, which is done by applying the extrusion voltage along a connector of interest, by creating a leakage path by implanting or doping a predetermined region using material such as arsenic that facilitates fusion when the extrusion voltage is applied. For example, when fabricating the synaptic array 120, after depositing the interconnect material for the crossbar 320, a mask 730 is laid on top of the crossbar 320. The mask 730 lays open the predetermined portion of the connectors that is to be implanted with the material conducive to fusing, such as arsenic.

The fabrication process is then continued to deposit the implanting material 720, which only applies to the predetermined portion of the connectors 710. The implant 720 can be based on the type of interconnect material used for the crossbar 320 so as to enhance the ions/electrons of the interconnect material to effect the leakage. Alternatively, or in addition, the implant 720 can also be based on the dielectric used as insulation for the connectors 710 to facilitate the formation of the synapses between the connectors 710.

In one or more examples, the implant 720 pre-treats the interconnect material to reduce the extrusion voltage that the neuromorphic controller 110 applies for causing the electromigration that leads to the formation/breaking of the synapse 530. For example, the implant 720 can reduce the breaking voltage of the barrier 540 from 5V to 2V. Thus, the implant 720 tunes the breakdown voltage of different regions of the crossbar 320 of the synaptic array 120. For example, predetermined regions of the crossbar 320 that is pre-treated with the implant 720 has lower breakdown voltage, and thus higher likelihood of formation of the synapse, compared to the regions that are not pre-treated with the implant 720. In other words, the technical features herein, of using the implant 720, facilitate selectively tuning regions of the connectors in the crossbar 320 to have different interfacial breakdown strengths.

It should be noted that while the examples herein describe reduction of interfacial breakdown strength using the implant 720, in other examples, the breakdown strength can be increased using the implant 720. For example, the implant 720, can be used to pre-treat the regions of the connectors 710 to increase the interfacial breakdown strength, where the synapses 530 are not to be generated in such regions.

In one or more examples, synaptic weighting facilitates one line from the connectors 710 to be used for more than one signal path. In one or more examples, the path of least resistance represents the dominant signal path. For example, FIG. 8 depicts a path-A 755 and a path-B that connects a single line (line-2) with two separate lines (line-1 and line-3) from the connectors 710 via the synapses 530.

Figure 9:
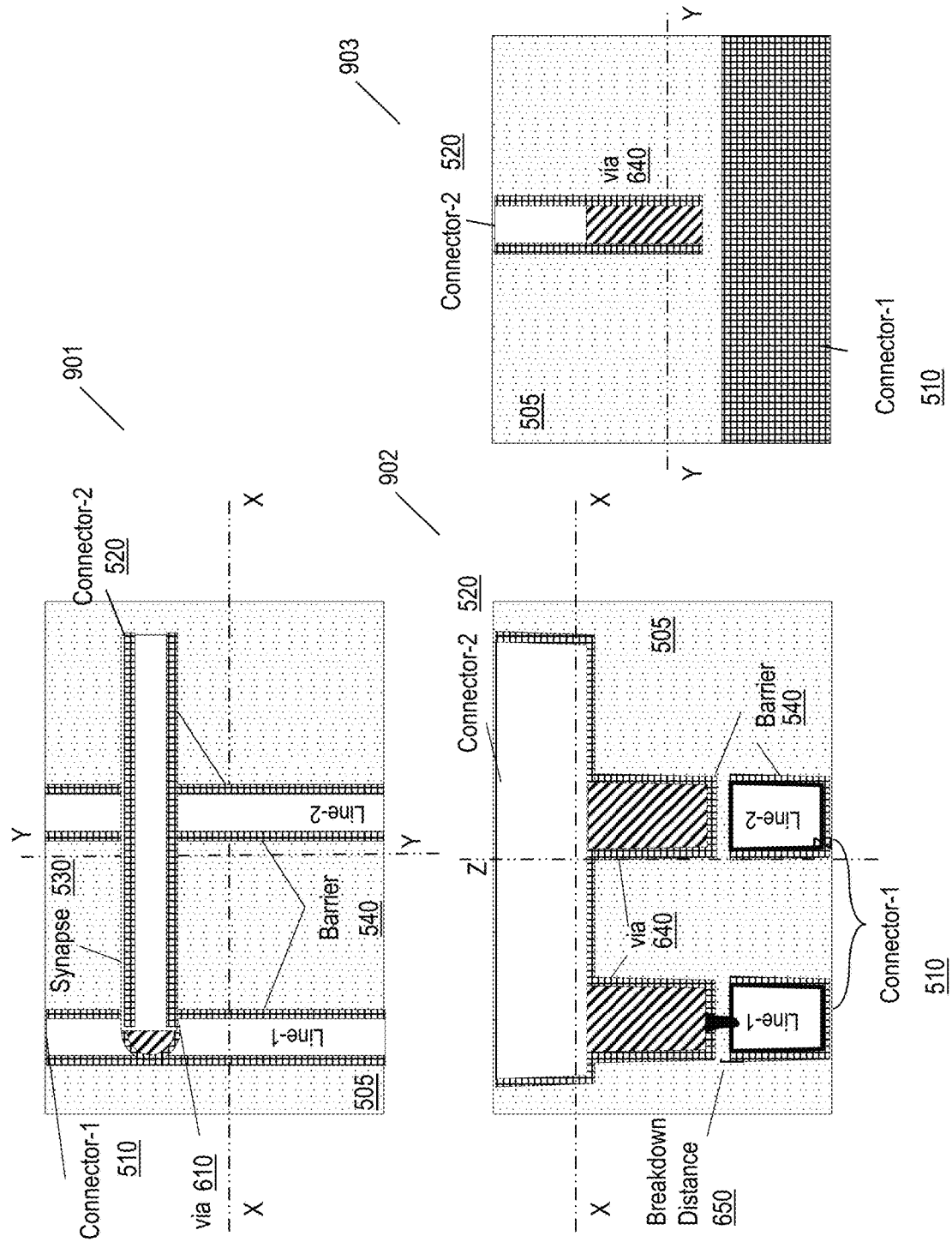
FIG. 9 illustrates an example of a semiconductor structure of the synaptic array fabricated for facilitating formation of synapses, according to one or more embodiments.

FIG. 9 illustrates an example of a semiconductor structure 900 of the synaptic array 120 fabricated for facilitating formation of synapses, according to one or more embodiments. FIG. 9 illustrates a top view 901, a cross-sectional view 902, and a side view 903 of the structure 900. The one or more layers of the semiconductor structure 900 are deposited using one or more known fabrication techniques.

In one or more examples, when fabricating the synaptic array 120, the via 610 is fabricated at a predetermined breakdown distance 650 from a lower level that includes the connector-1 510. For example, the interconnect material for the vias 610 is deposited such that is not fully landed on the lower level with the connectors 510. Another layer with the interconnect material is then deposited over the vias 610 to fabricate the higher/upper level with the connectors 520. The neuromorphic controller 110 can induce a short through the barrier 540 by applying an extrusion voltage at the vias 610 and/or a line from the connectors 510 in the lower level.

Each line from the connectors 510 is associated with respective electronic circuits 122. Further, the connector 520 is one from a set of connectors that are at the upper layer, and is associated with a corresponding electronic circuit. The connector 520 can be in contact with the vias 610, while the connectors 510 are at the predetermined breakdown distance 650 from the vias 610. The breakdown distance 650 is based on the material of the barrier 540, so that the extrusion voltage applied by the neuromorphic controller 110 can form the synapse 530 between one or more lines from the connectors 510 and the via 610, for example, as depicted in FIG. 9. In one or more examples, the synaptic array 120 is fabricated to selectively land the vias 610 by modifying the dimension of the printed via, versus the norm, placing the via 610 in different width lines, and/or combinations thereof. Further, as depicted in FIG. 9, in one or more examples, during fabrication of the synaptic array 120, after deposition of the interconnect material for the connectors 510, a layer of the barrier 540 is deposited at the breakdown distance 650, using one or more techniques for fabricating non-fully landed vias.

Further, the ends of the connectors 510 and the vias 610 that are adjacent to each other, are fabricated to be more conducive for the formation/breaking of the synapses 530. For example, the connectors 510 are fabricated with the barrier 540 being absent. In one or more examples, the barrier layer that is laid on the connectors 510 is etched using a mask, or any other technique, prior to deposition of the interconnect material to form the vias 610 at the breakdown distance 650 from the connectors 510. Alternatively, or in addition, the vias 610 and/or the connectors 510 are pre-treated with implant 720 at the adjacent ends as described herein to facilitate conduciveness of formation/breaking of the synapses 530 (see FIG. 7).

Figure 10:
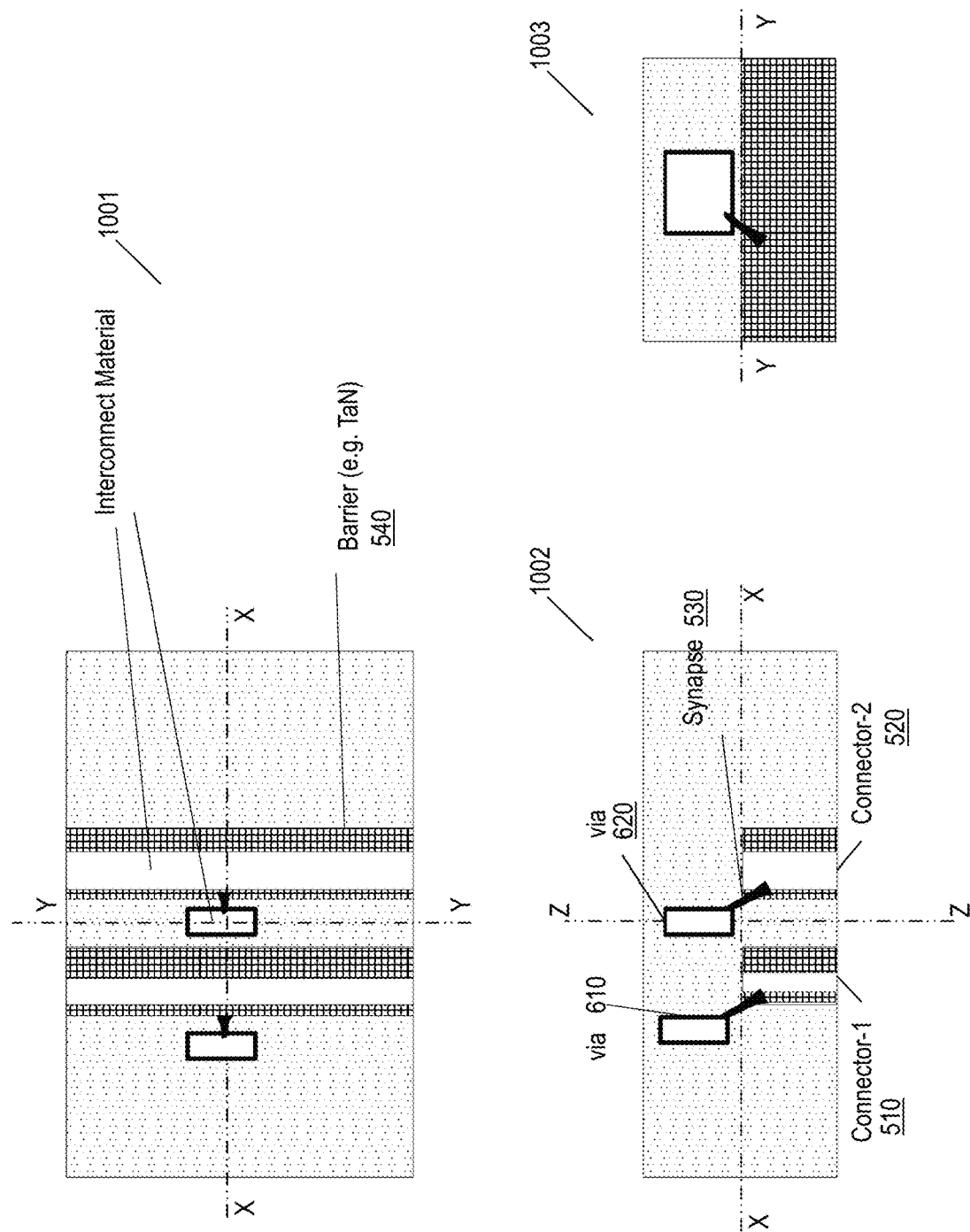
FIG. 10 illustrates an example of a semiconductor structure of the synaptic array fabricated for facilitating formation of synapses, according to one or more embodiments.

FIG. 10 illustrates an example semiconductor structure 1000 for the synaptic array 120 that makes formation/breaking of the synapses 530 conducive, according to one or more embodiments. FIG. 10 illustrates a top view 1001, a cross sectional view 1002, and a side view 1003 of the structure 1000. In the structure 1000 the predetermined connectors that are to be used for formation of the synapses 530 are fabricated in a manner to facilitate the formation.

For example, in the illustrated example, the barriers 540 along the two longitudinal edges of each of the connectors 510 and 520 are asymmetrical. For example, the barrier 540 that is adjacent to the via 610, where the synapse 530 is to be formed, is thinner than the barrier 540 on the other edge. In one or more examples, the trenches created for the barriers of the connectors 510 and 520 are created of different widths, one thinner than the other. Alternatively, if the barrier material is etched when depositing the interconnect material for the connectors 510 and 520, the etching mask used has the varying widths along the two edges.

Accordingly, the resulting connectors 510 and 520 that are fabricated have two longitudinal edges with barrier material, where the barrier along a first edge is thinner than a second edge. In one or more examples, the widths of the two barriers are predetermined. Further, the barrier adjacent to the via 610 is the thinner edge to facilitate formation of the synapse 530 towards the via 610. It should be noted, that although the example here illustrates formation of the synapse towards the via 610, in other examples, the synapse 530 can be formed to connect one connector directly to the other connector, without using the via 610 (see FIG. 5).

Further yet, as depicted in FIG. 10, the thinner barrier material on one side, and the thicker barrier material on the other side, ensure that each connector from the connectors 510 and 520 only form a synapse towards a corresponding via 610. For example, the connector-1 510 can be associated with a via 610, and the connector-2 520 can be associated with the via 620. Accordingly, the thinner barrier of the connector-1 510 is adjacent to the via 610, and the thicker barrier of the connector-1 is adjacent to the via 620. Further, when the neuromorphic controller 110 has to form/break the synapse 530 between the connector-1 and the via 610, the extrusion voltage is applied at the via 610. Similarly, applying the extrusion voltage at the via 620 results in the synapse 530 between the via 620 and the connector-2 520. The extrusion voltage at the via 620 does not cause the formation of a synapse with the connector-1 510 because the barrier material edge of the connector-1 adjacent to the via 620 is too thick for the extrusion voltage to overcome and breakdown the barrier material, as described herein.

The technical features herein facilitate fabrication of a synaptic array using high density semiconductor structure compatible with existing and next node BEOL technology. The synaptic array facilitates a neuromorphic system to evolve by formation/breaking of the synapses between connectors in a crossbar using electro-migration. For example, in an example, the neuromorphic system includes a controller that forms/breaks the synaptic connections after learning/receiving a task to be executed using one or more electronic circuits of the synaptic array. The technical features herein facilitate formation/breaking of physical synapses, which can be accessed rapidly, in comparison to virtually forming/breaking the synapses. In one or more examples, the synaptic array can be implemented in a passive interposer and connected to other logic and memory (e.g. DRAM) devices.

The technical features herein thus facilitate connecting electronic circuits, such as logic units as desired by applying a voltage field to short adjacent lines and vias as appropriate. The shorted paths, selectively applied, join the logic units to execute a task. The connections can be broken and a different path can be created that executes a different task. In biological terms, the technical features facilitate creating a solid-state synapse. In combination with pruning, such as using eFuse, the controller can create an efficient and flexible circuit designed for a specific task.

Thus, the technical solutions facilitate a neuromorphic system that is a high density non-volatile memory with 1 write state with an option to erase (eFUSE-like) certain connections, as opposed to typical RRAM, PCM type devices, that rely on a memory with 2 states.

In the embodiments described herein distance between the terminals where a synapse is formed are apart by a distance that is within a predetermined range. For example, the terminals that are be connected using the synapse are apart each other by <100 nm. Thus, when the terminals are selected to form the synapse, the system identifies the terminals that are within the predetermined range from each other. It should be noted that in other examples a different predetermined ranges may be used than the above example range of 0-100 nm.

The present technical solutions may be a system, a method, and/or a computer program product at any possible technical detail level of integration. The computer program product may include a computer readable storage medium (or media) having computer readable program instructions thereon for causing a processor to carry out aspects of the present technical solutions.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present technical solutions may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present technical solutions.

Aspects of the present technical solutions are described herein with reference to flowchart illustrations and/or block diagrams of methods, apparatus (systems), and computer program products according to embodiments of the technical solutions. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present technical solutions. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

A second action may be said to be "in response to" a first action independent of whether the second action results directly or indirectly from the first action. The second action may occur at a substantially later time than the first action and still be in response to the first action. Similarly, the second action may be said to be in response to the first action even if intervening actions take place between the first action and the second action, and even if one or more of the intervening actions directly cause the second action to be performed. For example, a second action may be in response to a first action if the first action sets a flag and a third action later initiates the second action whenever the flag is set.

To clarify the use of and to hereby provide notice to the public, the phrases "at least one of <A>, <B>, ... and <N>" or "at least one of <A>, <B>, ... <N>, or combinations thereof" or "<A>, <B>, ... and/or <N>" are to be construed in the broadest sense, superseding any other implied definitions hereinbefore or hereinafter unless expressly asserted to the contrary, to mean one or more elements selected from the group comprising A, B, ... and N. In other words, the phrases mean any combination of one or more of the elements A, B, ... or N including any one element alone or the one element in combination with one or more of the other elements which may also include, in combination, additional elements not listed.

It will also be appreciated that any module, unit, component, server, computer, terminal or device exemplified herein that executes instructions may include or otherwise have access to computer readable media such as storage media, computer storage media, or data storage devices (removable and/or non-removable) such as, for example, magnetic disks, optical disks, or tape. Computer storage media may include volatile and non-volatile, removable and non-removable media implemented in any method or technology for storage of information, such as computer readable instructions, data structures, program modules, or other data. Such computer storage media may be part of the device or accessible or connectable thereto. Any application or module herein described may be implemented using computer readable/executable instructions that may be stored or otherwise held by such computer readable media.

The descriptions of the various embodiments of the technical features herein have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer implemented method for configuring a synaptic array, the method comprising:
   selecting a first electronic circuit and a second electronic circuit from the synaptic array for executing a task; and
   connecting the first electronic circuit to the second electronic circuit to facilitate passage of electric current by applying a predetermined voltage to the first connector that forms a metallic protrusion to connect a first connector of the first electronic circuit and a second connector of the second electronic circuit, wherein the metallic protrusion is formed at a predetermined portion of the first connector, and wherein the predetermined portion is deposited with an implant material that reduces an extrusion voltage threshold of the predetermined portion to a value below the predetermined voltage that is applied.

2. The computer implemented method of claim 1, wherein the first electronic circuit is a memory unit.

3. The computer implemented method of claim 1, wherein the first electronic circuit is a processing unit.

4. The computer implemented method of claim 1, wherein the particular portion of the first connector has a barrier of a first thickness that is lesser than a second thickness of the barrier on other portions of the first connector.

5. The computer implemented method of claim 1, wherein the first connector and the second connector are parallel to each other.

6. The computer implemented method of claim 1, wherein the first connector and the second connector are oriented at a predetermined angle to each other.

7. A neuromorphic system comprising:
a synaptic array; and
a neuromorphic controller coupled with the synaptic array for configuring the synaptic array by:
- selecting a first electronic circuit and a second electronic circuit from the synaptic array for executing a task; and
- connecting the first electronic circuit to the second electronic circuit to facilitate passage of electric current by applying a predetermined voltage to the first connector that forms a metallic protrusion to connect a first connector of the first electronic circuit and a second connector of the second electronic circuit, wherein the metallic protrusion is formed at a predetermined portion of the first connector, and wherein the predetermined portion is deposited with an implant material that reduces an extrusion voltage threshold of the predetermined portion to a value below the predetermined voltage that is applied.

8. The neuromorphic system of claim 7, wherein the first electronic circuit is a memory unit.

9. The neuromorphic system of claim 7, wherein the first connector and the second connector are within a predetermined distance from each other.

10. The neuromorphic system of claim 7, wherein the first connector and the second connector are parallel to each other.

11. The neuromorphic system of claim 7, wherein the first connector and the second connector are oriented at a predetermined angle to each other.

12. The neuromorphic system of claim 7, wherein the first electronic circuit is a processing unit.

13. The neuromorphic system of claim 7, wherein the predetermined portion of the first connector has a barrier of a first thickness that is lesser than a second thickness of remaining portions of the first connector.

14. A computer program product for configuring a synaptic array, the computer program product comprising a computer readable storage medium having program instructions embodied therewith, the program instructions being executable by a processing circuit to cause the processing circuit to:
- select a first electronic circuit and a second electronic circuit from the synaptic array for executing a task; and
- connect the first electronic circuit to the second electronic circuit to facilitate passage of electric current by applying a predetermined voltage to the first connector that forms a metallic protrusion to connect a first connector of the first electronic circuit and a second connector of the second electronic circuit, wherein the metallic protrusion is formed at a predetermined portion of the first connector, and wherein the predetermined portion is deposited with an implant material that reduces an extrusion voltage threshold of the predetermined portion to a value below the predetermined voltage that is applied.

15. The computer program product of claim 14, wherein the first electronic circuit is a memory unit.

16. The computer program product of claim 14, wherein the first electronic circuit is a processing unit.

17. The computer program product of claim 14, wherein the first connector and the second connector are within a predetermined distance from each other.

18. The computer program product of claim 14, wherein the first connector and the second connector are parallel to each other.

19. The computer program product of claim 14, wherein the first connector and the second connector are oriented at a predetermined angle to each other.

20. The computer program product of claim 14, wherein the predetermined portion of the first connector has a barrier of a first thickness that is lesser than a second thickness of remaining portions of the first connector.

* * * * *